US012689387B2

(12) United States Patent　　　(10) Patent No.:　US 12,689,387 B2
　Shrivastava et al.　　　　　　　(45) Date of Patent:　Jul. 21, 2026

(54) SWITCHED CAPACITOR SLEW BOOST TECHNIQUE

(71) Applicant: Texas Instruments Incorporated, Dallas, TX (US)

(72) Inventors: Neeraj Shrivastava, Bangalore (IN); Sai Aditya Nurani, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 99 days.

(21) Appl. No.: 16/575,874

(22) Filed: Sep. 19, 2019

(65) Prior Publication Data

US 2021/0091778 A1　　Mar. 25, 2021

(51) Int. Cl.
　*H03M 1/12*　　　(2006.01)
　*G06F 1/26*　　　(2006.01)
(52) U.S. Cl.
　CPC .......... *H03M 1/1245* (2013.01); *G06F 1/263* (2013.01)
(58) Field of Classification Search
　CPC ........................... G06F 1/263; H03M 1/1245
　See application file for complete search history.

(56) References Cited

U.S. PATENT DOCUMENTS

| | | | | | |
|---|---|---|---|---|---|
| 7,733,182 B2 * | 6/2010 | Pham | ...................... | H03F 1/086 330/264 |
| 8,350,740 B2 * | 1/2013 | Akita | ................... | G11C 27/024 341/122 |

| | | | | | |
|---|---|---|---|---|---|
| 9,667,234 | B1 * | 5/2017 | Milkov | .............. | H03K 17/6871 |
| 2010/0109779 | A1 * | 5/2010 | Pham | ...................... | H03F 1/086 330/296 |
| 2012/0071122 | A1 * | 3/2012 | Akita | .................. | H03M 1/1245 341/172 |
| 2013/0181295 | A1 * | 7/2013 | Russell | .............. | H03K 19/0941 257/369 |
| 2018/0062595 | A1 * | 3/2018 | Osawa | ................. | H03G 1/0094 |
| 2019/0123757 | A1 * | 4/2019 | Chen | ..................... | H03M 1/442 |
| 2019/0363731 | A1 * | 11/2019 | Nezuka | ................. | H03M 3/456 |
| 2020/0083901 | A1 * | 3/2020 | Adusumalli | ........ | H03F 3/45928 |
| 2020/0295777 | A1 * | 9/2020 | Onishi | .................. | H03M 3/494 |

OTHER PUBLICATIONS

Random House Webster's College Dictionary Exhibit.*

* cited by examiner

*Primary Examiner* — Menatoallah Youssef
*Assistant Examiner* — Khareem E Almo
(74) *Attorney, Agent, or Firm* — Xianghui Huang; Frank D. Cimino

(57) ABSTRACT

In described examples, a switched capacitor circuit includes an amplifier that generates a first output signal in response to a first sampled input signal. A second sampling circuit is coupled to the amplifier and generates an output signal in response to the first output signal. A first current boost circuit is coupled to the amplifier and the second sampling circuit and provides current to the second sampling circuit when the first output signal is below a first threshold. A second current boost circuit is coupled to the amplifier and the second sampling circuit and receives current from the second sampling circuit when the first output signal is above a second threshold.

21 Claims, 3 Drawing Sheets

500

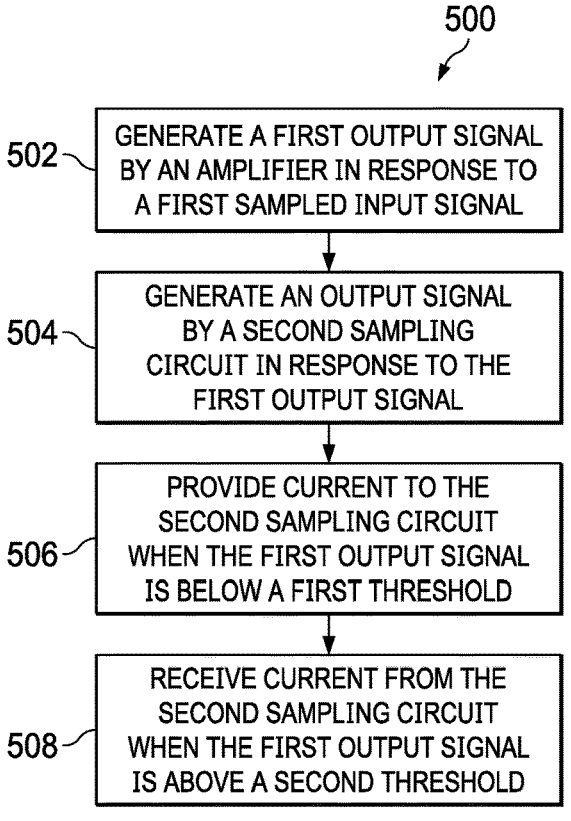

502 — GENERATE A FIRST OUTPUT SIGNAL BY AN AMPLIFIER IN RESPONSE TO A FIRST SAMPLED INPUT SIGNAL

504 — GENERATE AN OUTPUT SIGNAL BY A SECOND SAMPLING CIRCUIT IN RESPONSE TO THE FIRST OUTPUT SIGNAL

506 — PROVIDE CURRENT TO THE SECOND SAMPLING CIRCUIT WHEN THE FIRST OUTPUT SIGNAL IS BELOW A FIRST THRESHOLD

508 — RECEIVE CURRENT FROM THE SECOND SAMPLING CIRCUIT WHEN THE FIRST OUTPUT SIGNAL IS ABOVE A SECOND THRESHOLD

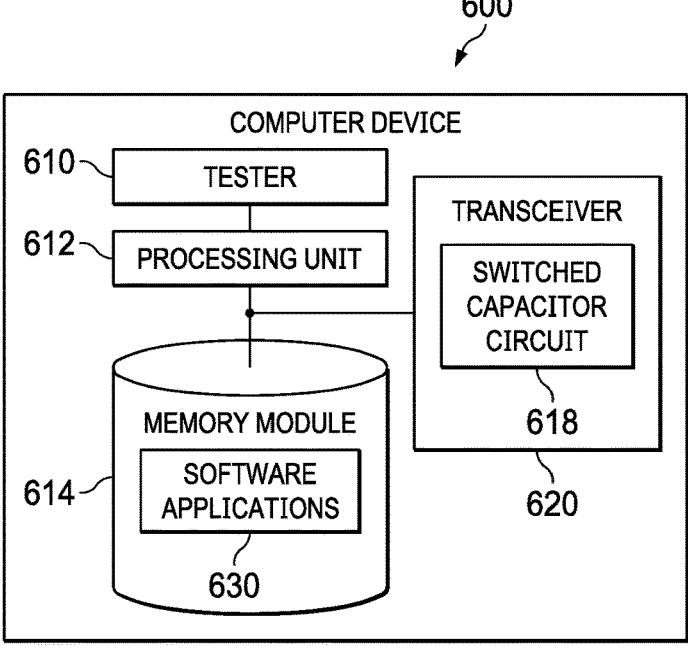

COMPUTER DEVICE

610 — TESTER

612 — PROCESSING UNIT

614 — MEMORY MODULE

SOFTWARE APPLICATIONS

630

TRANSCEIVER

SWITCHED CAPACITOR CIRCUIT

SWITCHED CAPACITOR SLEW BOOST TECHNIQUE

TECHNICAL FIELD

The present disclosure is generally related to analog to digital converter (ADC), and more particularly to a switched capacitor circuit implemented in ADC.

BACKGROUND

The wireless base stations are changing from conventional RF (radio frequency) signal chain to RF sampling analog to digital converters (ADCs) thus avoiding use of multiple components such as mixers and filters. RF sampling ADCs are preferred because of low complexity, low cost and low processing requirements. RF sampling ADCs also enable complete spectral sampling and multi-band support. RF sampling ADCs are typically pipeline ADCs with multiple stages, and each stage includes an input sampling circuit, a sub-ADC, a DAC and a residue amplifier. Each stage is equivalent to a switched capacitor circuit.

The RF sampling ADCs are high speed ADCs with very low sample and hold periods which are in the order of picoseconds. The sample and hold period, thus is not sufficient to resolve the desired number of bits. Thus, buffers or amplifiers are provided to store a set of inputs for a defined time before providing these set of inputs to the next stage. These buffers or amplifiers take a huge amount of current especially if they are used in front end of the ADC, and also degrade the noise figure of the RF sampling ADC.

SUMMARY

In described examples, a switched capacitor circuit includes an amplifier that generates a first output signal in response to a first sampled input signal. A second sampling circuit is coupled to the amplifier and generates an output signal in response to the first output signal. A first current boost circuit is coupled to the amplifier and the second sampling circuit and provides current to the second sampling circuit when the first output signal is below a first threshold. A second current boost circuit is coupled to the amplifier and the second sampling circuit and receives current from the second sampling circuit when the first output signal is above a second threshold.

BRIEF DESCRIPTION OF THE DRAWINGS

FIG. 5 is a flowchart of a method of operation of a switched capacitor circuit, according to an embodiment;
and
FIG. 6 illustrates a computing device, according to an embodiment.

DETAILED DESCRIPTION OF EXAMPLE EMBODIMENTS

Figure 1:
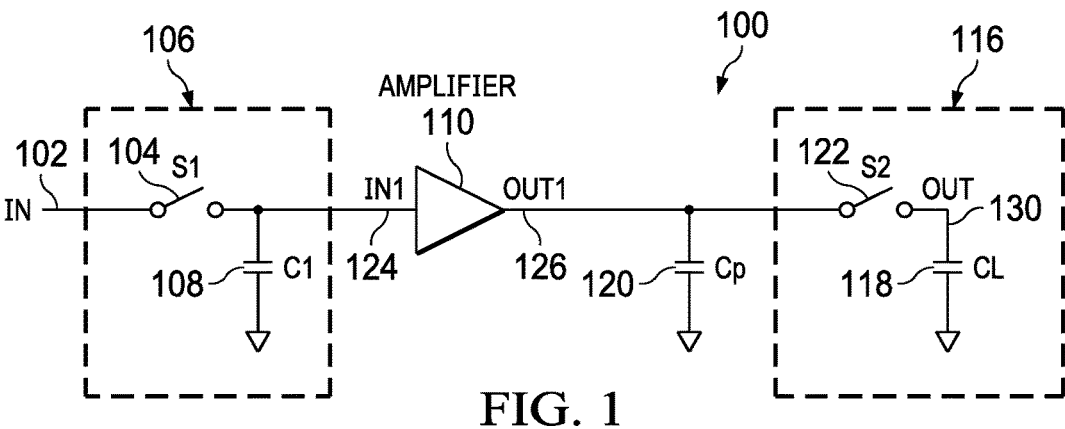
FIG. 1 illustrates a switched capacitor circuit.

FIG. 1 illustrates a switched capacitor circuit 100. The switched capacitor circuit 100 includes a first sampling circuit 106, an amplifier 110 and a second sampling circuit 116. The first sampling circuit 106 includes a first switch S1 104 and a first capacitor C1 108. The second sampling circuit 116 includes a second switch S2 122 and a load capacitor CL 118. The amplifier 110 is coupled between the first sampling circuit 106 and the second sampling circuit 116. A parasitic capacitance Cp 120 is coupled to the amplifier 110. An integrated circuit includes multiple components packed in multiple layers. The proximity of these multiple components and their configuration in multiple layers produce this parasitic capacitance represented as Cp 120.

The first sampling circuit 106 receives an input signal IN 102 and generates a first sampled input signal IN1 124. The amplifier 110 amplifies the first sampled input signal IN1 124 to generate a first output signal OUT1 126. In one example, the amplifier 110 is a buffer for holding the first sampled input signal IN1 124 for a predefined time period. The second sampling circuit 116 generates an output signal OUT 130 in response to the first output signal OUT1 126 received from the amplifier 110.

The switched capacitor circuit 100, in one example, is a representation of a single stage of a pipeline ADC (analog to digital converter). The amplifier 110 which acts as a buffer takes huge amount of current especially in front end of the pipeline ADC as desired settling accuracy is very high. Also, the amplifier 110 degrades a noise figure of the pipeline ADC. The noise figure of the ADC is dependent on the load capacitor CL 118. The higher the load capacitor CL 118, the better is the noise figure. A higher load capacitor CL118 results in higher settling time, and hence more current is provided to the switched capacitor circuit 100 to maintain high settling accuracy. Thus, the switched capacitor circuit 100 is not useful for an RF ADC used in high speed applications.

Figure 2:
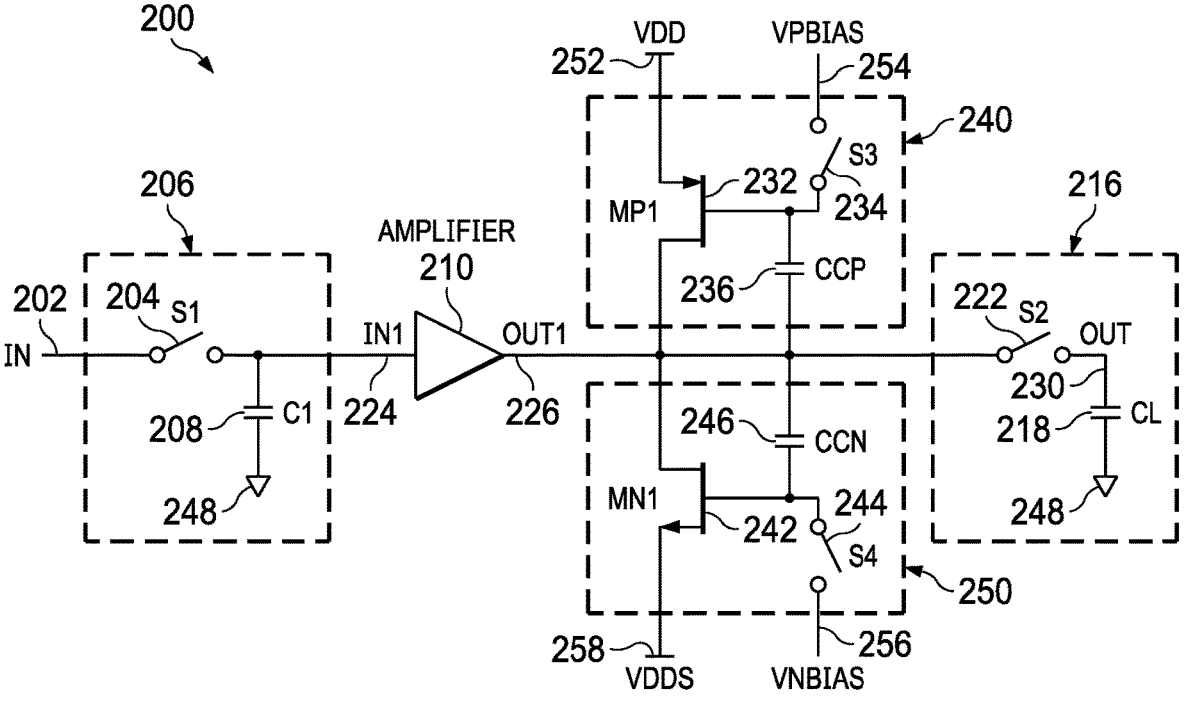
FIG. 2 illustrates a switched capacitor circuit, according to an embodiment.

FIG. 2 illustrates a switched capacitor circuit 200, according to an embodiment. The switched capacitor circuit 200 includes a first sampling circuit 206, an amplifier 210, a second sampling circuit 216, a first current boost circuit 240 and a second current boost circuit 250. The first sampling circuit 206 includes a first switch S1 204 and a first capacitor C1 208. A top plate of the first capacitor C1 208 is coupled to the first switch S1 204 and a bottom plate of the first capacitor C1 208 is coupled to a ground terminal 248.

The second sampling circuit 216 includes a second switch S2 222 and a load capacitor CL 218. A top plate of the load capacitor CL 218 is coupled to the second switch S2 222 and a bottom plate of the load capacitor CL 218 is coupled to the ground terminal 248. The amplifier 210 is coupled between the first sampling circuit 206 and the second sampling circuit 216.

The first current boost circuit 240 is coupled to the amplifier 210 and the second sampling circuit 216. The first current boost circuit 240 includes a PMOS transistor MP1 232, a third switch S3 234 and a primary capacitor CCP 236. A source terminal of the PMOS transistor MP1 232 is coupled to a primary voltage source VDD 252, and a drain terminal of the PMOS transistor MP1 232 is coupled to the amplifier 210. The third switch S3 234 is coupled to a gate terminal of the PMOS transistor MP1 232. The third switch S3 234 receives a primary bias voltage VPBIAS 254. A top plate of the primary capacitor CCP 236 is coupled to the gate terminal of the PMOS transistor MP1 232 and a bottom plate of the primary capacitor CCP 236 is coupled to the amplifier 210.

The second current boost circuit 250 is coupled to the amplifier 210 and the second sampling circuit 216. The second current boost circuit 250 includes an NMOS transistor MN1 242, a fourth switch S4 244 and a secondary capacitor CCN 246. A source terminal of the NMOS transistor MN1 242 is coupled to a secondary voltage source VDDS 258, and a drain terminal of the NMOS transistor MN1 242 is coupled to the amplifier 210. The fourth switch S4 244 is coupled to a gate terminal of the NMOS transistor MN1 242. The fourth switch S4 244 receives a secondary bias voltage VNBIAS 256. A top plate of the secondary capacitor CCN 246 is coupled to the amplifier 210 and a bottom plate of the secondary capacitor CCN 246 is coupled to the gate terminal of the NMOS transistor MN1 242. The switched capacitor circuit 200 may include one or more additional components that are not described herein for simplicity of the description.

In operation, the switched capacitor circuit 200 (FIG. 2) operates in a first phase and a second phase. In the first phase, the first switch S1 204, the third switch S3 234 and the fourth switch S4 244 are closed and the second switch S2 222 is opened. The first sampling circuit 206 receives an input signal IN 202 and generates a first sampled input signal IN1 224. The amplifier 210 generates a first output signal OUT1 226 in response to the first sampled input signal IN1 224. The values of the primary bias voltage VPBIAS 254 and the secondary bias voltage VNBIAS 256 are selected such that the PMOS transistor MP1 232 and the NMOS transistor MN1 242 both operate in a cut-off region respectively. The first output signal OUT1 226 is sampled on the primary capacitor CCP 236 and the secondary capacitor CCN 246. In one example, the first output signal OUT1 226 follows the first sampled input signal IN1 224 and settles fast as there is no load since the second switch S2 222 is open.

In the second phase, the second switch S2 222 is closed and the first switch S1 204, the third switch S3 234 and the fourth switch S4 244 are opened. Thus, the load capacitor CL 218 gets coupled to the amplifier 210. This results in a glitch in the first output signal OUT 1 226. The glitch causes the first output signal OUT1 226 to go below a first threshold or to go above a second threshold. The load capacitor CL 218 receives current from the primary voltage source VDD 252 through the PMOS transistor MP1 232 if the first output signal OUT1 226 is below the first threshold. When the first output signal OUT1 226 is below the first threshold, a voltage at each of the gate terminal of the PMOS transistor MP1 232 and the NMOS transistor MN1 242 is pulled below a first predefined value. This result in the NMOS transistor MN1 242 operating in the cut-off region, and the PMOS transistor MP1 232 operating in one of a linear region and a saturation region. Thus, the first current boost circuit 240 provides current to the second sampling circuit 216 when the first output signal OUT1 226 is below the first threshold. This results in faster settling of the first output signal OUT1 226.

The load capacitor CL 218 sinks current to the secondary voltage source VDDS 258 through the NMOS transistor MN1 242 if the first output signal OUT1 226 is above the second threshold. When the first output signal OUT1 226 is above the second threshold, a voltage at each of the gate terminal of the PMOS transistor MP1 232 and the NMOS transistor MN1 242 is pulled above a second predefined value. This result in the PMOS transistor MP1 232 operating in the cut-off region, and the NMOS transistor MN1 242 operating in one of a linear region and a saturation region. Thus, the second current boost circuit 250 receives current from the second sampling circuit 216 when the first output signal OUT1 226 is above the second threshold. This results in faster settling of the first output signal OUT1 226.

When the first output signal OUT1 226 is close to a final settling value or is between the first threshold and the second threshold, the PMOS transistor MP1 232 and the NMOS transistor MN1 242 both operate in the cut-off region. In the second phase, the second sampling circuit 216 generates an output signal OUT 230 in response to the first output signal OUT1 226.

The switched capacitor circuit 200, in one example, is a representation of a single stage of a pipeline ADC. Thus, the switched capacitor circuit 200 overcomes the drawbacks of the switched capacitor circuit 100. The switched capacitor circuit 200 provides faster settling accuracy because of the first current boost circuit 240 and the second current boost circuit 250. This also helps maintain linearity performance of ADC. Both first current boost circuit 240 and the second current boost circuit 250 operate during transients and do not interfere with final settling. Hence, the settling accuracy of the switched capacitor circuit 200 is high. The noise figure of the switched capacitor circuit 200 is maintained without providing more current to the amplifier 210. Thus, the switched capacitor circuit 200 finds application in high speed RF ADCs.

Figures 3, 4:
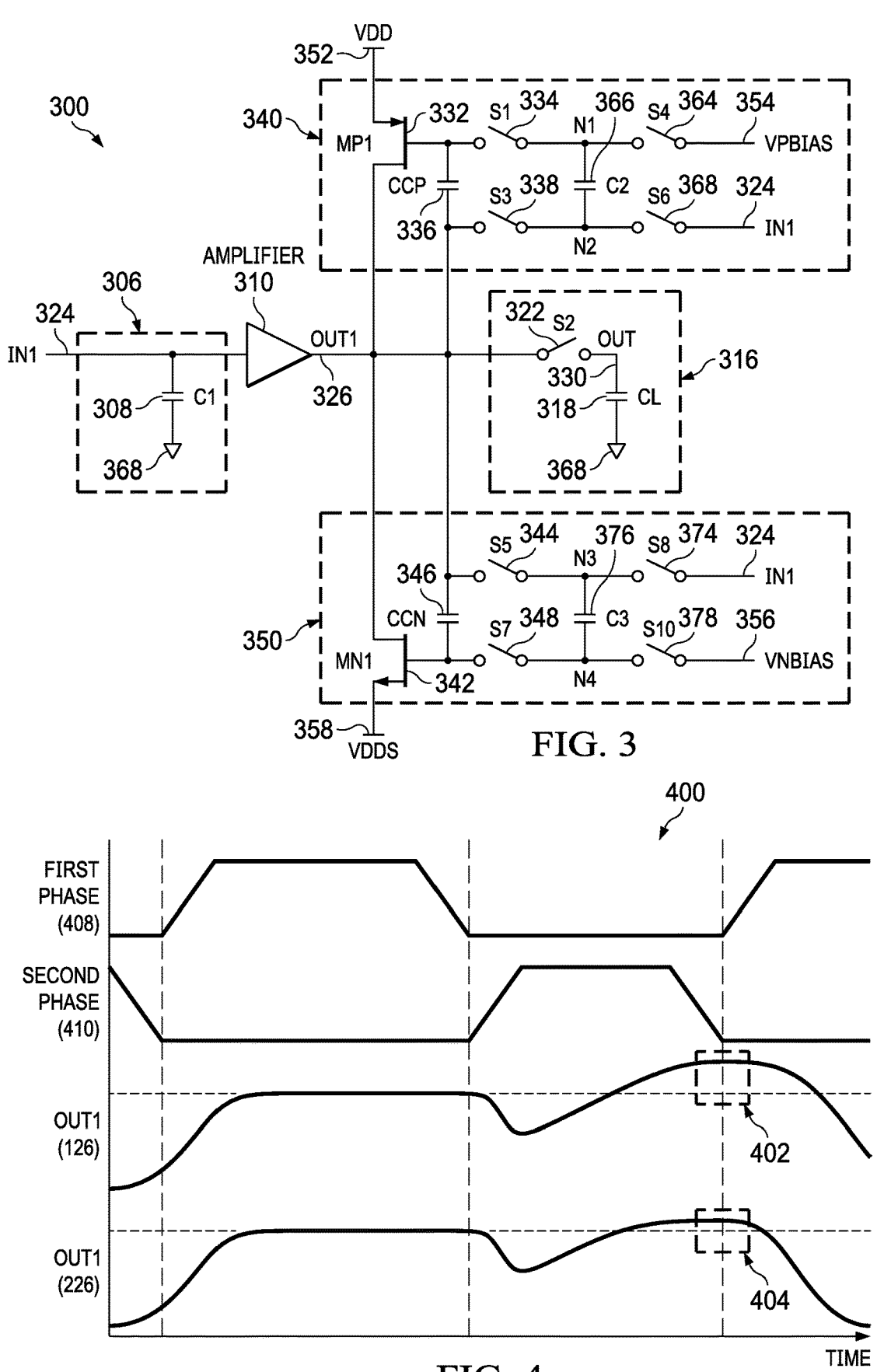
FIG. 3 illustrates a switched capacitor circuit, according to an embodiment.
FIG. 4 is a is a timing diagram to illustrate operation of the switched capacitor circuit of FIG. 2, according to an embodiment

FIG. 3 illustrates a switched capacitor circuit 300, according to an embodiment. The switched capacitor circuit 300 includes a first sampling circuit 306, an amplifier 310, a second sampling circuit 316, a first current boost circuit 340 and a second current boost circuit 350. The first sampling circuit 306 includes a first capacitor C1 308. A top plate of the first capacitor C1 308 is coupled to the amplifier 310 and a bottom plate of the first capacitor C1 308 is coupled to a ground terminal 368.

The second sampling circuit 316 includes a second switch S2 322 and a load capacitor CL 318. A top plate of the load capacitor CL 318 is coupled to the second switch S2 322 and a bottom plate of the load capacitor CL 318 is coupled to the ground terminal 368. The amplifier 310 is coupled between the first sampling circuit 306 and the second sampling circuit 316.

The first current boost circuit 340 is coupled to the amplifier 310 and the second sampling circuit 316. The first current boost circuit 340 includes a PMOS transistor MP1 332, a first switch S1 334, a third switch S3 338, a fourth switch S4 364, a sixth switch S6 368, a second capacitor C2 366 and a primary capacitor CCP 336. A source terminal of the PMOS transistor MP1 332 is coupled to a primary voltage source VDD 352, and a drain terminal of the PMOS transistor MP1 332 is coupled to the amplifier 310. The first switch S1 334 is coupled to a gate terminal of the PMOS transistor MP1 332 and a first node N1.

The fourth switch S4 364 is coupled to the first node N1 and receives a primary bias voltage VPBIAS 354. A top plate of the primary capacitor CCP 336 is coupled to the gate terminal of the PMOS transistor MP1 332 and a bottom plate of the primary capacitor CCP 336 is coupled to the amplifier 310. The third switch S3 338 is coupled to the bottom plate of the primary capacitor CCP 336 and a second node N2. The sixth switch S6 368 is coupled to the second node N2 and receives the first sampled input signal IN1 324. The second capacitor C2 366 is coupled between the first node N1 and the second node N2.

The second current boost circuit 350 is coupled to the amplifier 310 and the second sampling circuit 316. The second current boost circuit 350 includes an NMOS transistor MN1 342, a fifth switch S5 344, a seventh switch S7 348, an eight switch S8 374, a tenth switch S10 378, a third capacitor C3 376 and a secondary capacitor CCN 346. A source terminal of the NMOS transistor MN1 342 is coupled to a secondary voltage source VDDS 358, and a drain terminal of the NMOS transistor MN1 342 is coupled to the amplifier 310. A top plate of the secondary capacitor CCN 346 is coupled to the amplifier 310 and a bottom plate of the secondary capacitor CCN 346 is coupled to the gate terminal of the NMOS transistor MN1 342.

The fifth switch S5 344 is coupled to the top plate of the secondary capacitor CCN 346 and a third node N3. The eight switch S8 374 is coupled to the third node N3 and receives the first sampled input signal IN1 324. The seventh switch S7 348 is coupled to the gate terminal of the NMOS transistor MN1 342 and a fourth node N4. The tenth switch is coupled to the fourth node N4 and receives a secondary bias voltage VNBIAS 356. The third capacitor C3 376 is coupled between the third node N3 and the fourth node N4. The switched capacitor circuit 300 may include one or more additional components that are not described herein for simplicity of the description.

In operation, the switched capacitor circuit 300 (FIG. 3) operates in a first phase and a second phase. In the first phase, odd switches (the first switch S1 334, the third switch S3 338, the fifth switch S5 344 and the seventh switch S7 348) are closed and the even switches (the second switch S2 322, the fourth switch S4 364, the sixth switch S6 368, the eight switch S8 374 and the tenth switch S10 378) are opened. The first sampling circuit 306 provides the first sampled input signal IN1 324 to the amplifier 310. The amplifier 310 generates a first output signal OUT1 326 in response to the first sampled input signal IN1 324. The values of the primary bias voltage VPBIAS 354 and the secondary bias voltage VNBIAS 356 are selected such that the PMOS transistor MP1 332 and the NMOS transistor MN1 342 both operate in a cut-off region respectively. The first output signal OUT1 326 is sampled on the primary capacitor CCP 336 and the secondary capacitor CCN 346. In one example, the first output signal OUT1 326 follows the first sampled input signal IN1 324 and settles fast as there is no load since the second switch S2 322 is open.

In the second phase, the odd switches are opened and the even switches are closed. Thus, the load capacitor CL 318 gets coupled to the amplifier 310. This results in a glitch in the first output signal OUT 1 326. The glitch causes the first output signal OUT1 326 to go below a first threshold or to go above a second threshold. The load capacitor CL 318 receives current from the primary voltage source VDD 352 through the PMOS transistor MP1 332 if the first output signal OUT1 326 is below the first threshold. When the first output signal OUT1 326 is below the first threshold, a voltage at each of the gate terminal of the PMOS transistor MP1 332 and the NMOS transistor MN1 342 is pulled below a first predefined value. This result in the NMOS transistor MN1 342 operating in the cut-off region, and the PMOS transistor MP1 332 operating in one of a linear region and a saturation region. Thus, the first current boost circuit 340 provides current to the second sampling circuit 316 when the first output signal OUT1 326 is below the first threshold. This results in faster settling of the first output signal OUT1 326.

The load capacitor CL 318 sinks current to the secondary voltage source VDDS 358 through the NMOS transistor MN1 342 if the first output signal OUT1 326 is above the second threshold. When the first output signal OUT1 326 is above the second threshold, a voltage at each of the gate terminal of the PMOS transistor MP1 332 and the NMOS transistor MN1 342 is pulled above a second predefined value. This result in the PMOS transistor MP1 332 operating in the cut-off region, and the NMOS transistor MN1 342 operating in one of a linear region and a saturation region. Thus, the second current boost circuit 350 receives current from the second sampling circuit 316 when the first output signal OUT1 326 is above the second threshold. This results in faster settling of the first output signal OUT1 326.

A charge equivalent to a difference between the primary bias voltage VPBIAS 354 and the first sampled input signal IN1 324 gets accumulated at the second capacitor C2 366. Also, a charge equivalent to a difference between the secondary bias voltage VNBIAS 356 and the first sampled input signal IN1 324 gets accumulated at the third capacitor C3 376. These are transferred to the primary capacitor CCP 336 and the secondary capacitor CCN 346, respectively, in the first phase.

When the first output signal OUT1 326 is close to a final settling value or is between the first threshold and the second threshold, the PMOS transistor MP1 332 and the NMOS transistor MN1 342 both operate in the cut-off region. In the second phase, the second sampling circuit 316 generates an output signal OUT 330 in response to the first output signal OUT1 326.

The switched capacitor circuit 300, in one example, is a representation of a reference amplifier. Thus, the switched capacitor circuit 300 overcomes the drawbacks of the switched capacitor circuit 100. The switched capacitor circuit 300 provides faster settling accuracy because of the first current boost circuit 340 and the second current boost circuit 350. This also helps maintain linearity performance of ADC. Both first current boost circuit 340 and the second current boost circuit 350 operate during transients and do not interfere with final settling. Hence, the settling accuracy of the switched capacitor circuit 300 is high. The noise figure of the switched capacitor circuit 300 is maintained without providing more current to the amplifier 310. Thus, the switched capacitor circuit 300 finds application in high speed RF ADCs.

FIG. 4 is a timing diagram 400 to illustrate operation of the switched capacitor circuit of FIG. 2, according to an embodiment. 408 represents the first phase and 410 represents the second phase as discussed with respect to the switched capacitor circuit 200. The variation of the first output signal OUT1 126 (FIG. 1) and the first output signal OUT1 226 (FIG. 2) with respect to time is also illustrated in the timing diagram 400. The first output signal OUT1 126 in the switched capacitor circuit 100 does not settle after second phase as represented by 402.

On the contrary, the first output signal OUT1 226 in the switched capacitor circuit 200 settles fast as represented by 404. The switched capacitor circuit 200 provides faster settling accuracy because of the first current boost circuit 240 and the second current boost circuit 250. This also helps maintain linearity performance when switched capacitor circuit 200 is part of an ADC. Both first current boost circuit 240 and the second current boost circuit 250 operate during transients and do not interfere with final settling. Hence, the settling accuracy of the switched capacitor circuit 200 is high.

FIG. 5 is a flowchart 500 of a method of operation of a switched capacitor circuit, according to an embodiment. The flowchart 500 is explained in connection with the switched capacitor circuit 200 illustrated in FIG. 2. At step 502, a first output signal is generated by an amplifier in response to a first sampled input signal. A first switch is closed and the input signal is sampled on a first capacitor to generate the first sampled input signal. An output signal is generated by a second sampling circuit in response to the first output signal, at step 504. The second sampling circuit includes a load capacitor. In the switched capacitor circuit 200, in the first phase, the first sampling circuit 206 receives an input signal IN 202 and generates a first sampled input signal IN1 224. The amplifier 210 generates a first output signal OUT1 226 in response to the first sampled input signal IN1 224. In the second phase, the second sampling circuit 216 generates an output signal OUT 230 in response to the first output signal OUT1 226.

At step 506, current is provided to the second sampling circuit when the first output signal is below a first threshold. The current is provided by a first current boost circuit which includes a PMOS transistor and a primary capacitor. In the switched capacitor circuit 200, the load capacitor CL 218 receives current from the primary voltage source VDD 252 through the PMOS transistor MP1 232 if the first output signal OUT1 226 is below the first threshold. When the first output signal OUT1 226 is below the first threshold, a voltage at each of the gate terminal of the PMOS transistor MP1 232 and the NMOS transistor MN1 242 is pulled below a first predefined value. This result in the NMOS transistor MN1 242 operating in the cut-off region, and the PMOS transistor MP1 232 operating in one of a linear region and a saturation region. Thus, the first current boost circuit 240 provides current to the second sampling circuit 216 when the first output signal OUT1 226 is below the first threshold. This results in faster settling of the first output signal OUT1 226.

At step 508, current is received from the second sampling circuit when the first output signal is above a second threshold. A second current boost circuit receives the current from the second sampling circuit when the first output signal is above a second threshold. The second current boost circuit includes an NMOS transistor and a secondary capacitor. In the switched capacitor circuit 200, the load capacitor CL 218 sinks current to the secondary voltage source VDDS 258 through the NMOS transistor MN1 242 if the first output signal OUT1 226 is above the second threshold. When the first output signal OUT1 226 is above the second threshold, a voltage at each of the gate terminal of the PMOS transistor MP1 232 and the NMOS transistor MN1 242 is pulled above a second predefined value. This result in the PMOS transistor MP1 232 operating in the cut-off region, and the NMOS transistor MN1 242 operating in one of a linear region and a saturation region. Thus, the second current boost circuit 250 receives current from the second sampling circuit 216 when the first output signal OUT1 226 is above the second threshold. This results in faster settling of the first output signal OUT1 226.

When the first output signal OUT1 226 is close to a final settling value or is between the first threshold and the second threshold, the PMOS transistor MP1 232 and the NMOS transistor MN1 242 both operate in the cut-off region. The method illustrated by flowchart 500 provides faster settling accuracy when implemented in a pipeline ADC. This also helps maintain linearity performance of ADC. The method provides use of the first current boost circuit 240 and the second current boost circuit 250 that operate during transients and do not interfere with final settling. Hence, the settling accuracy of a switched capacitor circuit using this method is high. The noise figure of such switched capacitor circuit is maintained without providing more current to the amplifier used in the ADC. Thus, the method finds application in high speed RF ADCs.

FIG. 6 illustrates a computing device 600, according to an embodiment. The computing device 600 is, or is incorporated into, a mobile communication device, such as a mobile phone, a personal digital assistant, a transceiver, a personal computer, or any other type of electronic system. The computing device 600 may include one or more additional components known to those skilled in the relevant art and are not discussed here for simplicity of the description.

In some embodiments, the computing device 600 comprises a megacell or a system-on-chip (SoC) which includes a processing unit 612 such as a CPU (Central Processing Unit), a memory module 614 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP).

The memory module 614 (which can be memory such as RAM, flash memory, or disk storage) stores one or more software applications 630 (e.g., embedded applications) that, when executed by the processing unit 612, performs any suitable function associated with the computing device 600. The tester 610 comprises logic that supports testing and debugging of the computing device 600 executing the software applications 630.

For example, the tester 610 can be used to emulate a defective or unavailable component(s) of the computing device 600 to allow verification of how the component(s), were it actually present on the computing device 600, would perform in various situations (e.g., how the component(s) would interact with the software applications 630). In this way, the software applications 630 can be debugged in an environment which resembles post-production operation.

The processing unit 612 typically comprises memory and logic which store information frequently accessed from the memory module 614. The computing device 600 includes a transceiver 620. The transceiver 620 is coupled to the processing unit 612 and the memory module 614. The transceiver 620 includes a switched capacitor circuit 618. The switched capacitor circuit 618 is similar in connection and operation to at least one of the switched capacitor circuit 200 and the switched capacitor circuit 300. The switched capacitor circuit 618 includes a first sampling circuit, an amplifier, a second sampling circuit, a first current boost circuit and a second current boost circuit. The first boost circuit includes a PMOS transistor and a primary capacitor. The second current boost circuit includes an NMOS transistor and a secondary capacitor. The second sampling circuit includes a load capacitor.

The switched capacitor circuit 618 operates in a first phase and a second phase. In the first phase, the first sampling circuit receives an input signal and generates a first sampled input signal. The amplifier generates a first output signal in response to the first sampled input signal. The first output signal is sampled on the primary capacitor and the secondary capacitor.

In the second phase, the load capacitor gets coupled to the amplifier. This results in a glitch in the first output signal. The load capacitor receives current through the PMOS transistor if the first output signal is below the first threshold. When the first output signal is below the first threshold, a voltage at each of the gate terminal of the PMOS transistor and the NMOS transistor is pulled below a first predefined value. This result in the NMOS transistor operating in the cut-off region, and the PMOS transistor operating in one of a linear region and a saturation region. Thus, the first current boost circuit provides current to the second sampling circuit when the first output signal is below the first threshold. This results in faster settling of the first output signal.

The load capacitor sinks current through the NMOS transistor if the first output signal is above the second threshold. When the first output signal is above the second threshold, a voltage at each of the gate terminal of the PMOS transistor and the NMOS transistor is pulled above a second predefined value. This result in the PMOS transistor operating in the cut-off region, and the NMOS transistor operating in one of a linear region and a saturation region. Thus, the second current boost circuit receives current from the second sampling circuit when the first output signal is above the second threshold. This results in faster settling of the first output signal. When the first output signal is close to a final settling value or is between the first threshold and the second threshold, the PMOS transistor and the NMOS transistor both operate in the cut-off region. In the second phase, the second sampling circuit generates an output signal in response to the first output signal.

The switched capacitor circuit 618, when part of an ADC, provides faster settling accuracy because of the first current boost circuit and the second current boost circuit. This also helps maintain linearity performance of ADC. Both first current boost circuit and the second current boost circuit operate during transients and do not interfere with final settling. Hence, the settling accuracy of the switched capacitor circuit 618 is high. The noise figure of the switched capacitor circuit 618 is maintained without providing more current to the amplifier.

Modifications are possible in the described embodiments, and other embodiments are possible, within the scope of the claims.

What is claimed is:

1. A switched capacitor circuit comprising:
an amplifier configured to generate a first output signal in response to a first sampled input signal;
a second sampling circuit coupled to the amplifier and configured to generate an output signal in response to the first output signal;
a first current boost circuit coupled to the amplifier and the second sampling circuit and configured to provide current to the second sampling circuit when the first output signal is below a first threshold, the first current boost circuit further including:
a PMOS transistor coupled to a first voltage source terminal;
a third switch coupled to a gate terminal of the PMOS transistor; and
a first capacitor coupled to the gate terminal of the PMOS transistor and the amplifier; and
a second current boost circuit coupled to the amplifier and the second sampling circuit configured to receive current from the second sampling circuit when the first output signal is above a second threshold, the second current boost circuit includes an NMOS transistor and the second threshold is greater than the first threshold, and a drain terminal of both the PMOS transistor and the NMOS transistor is coupled to the amplifier.

2. The switched capacitor circuit of claim 1 further comprising a first sampling circuit coupled to the amplifier and configured to generate the first sampled input signal in response to an input signal.

3. The switched capacitor circuit of claim 2, wherein the first sampling circuit comprises:
a first switch configured to receive the input signal; and
a second capacitor having a top plate coupled to the first switch and the amplifier and having a bottom plate coupled to a ground terminal.

4. The switched capacitor circuit of claim 3, wherein the second sampling circuit comprises:
a second switch configured to receive the first output signal; and a load capacitor having a top plate coupled to the second switch and having a bottom plate coupled to the ground terminal.

5. The switched capacitor circuit of claim 4, wherein the third switch is configured to receive a first bias voltage; and
a source terminal of the PMOS transistor is coupled to the first voltage source terminal, the first voltage source terminal configured to be coupled to a first voltage source.

6. The switched capacitor circuit of claim 5, wherein the second current boost circuit comprises:
a fourth switch coupled to a gate terminal of the NMOS transistor and configured to receive a second bias voltage; and
a second capacitor coupled to the gate terminal of the NMOS transistor and the amplifier, wherein a source terminal of the NMOS transistor is coupled to a second voltage source.

7. The switched capacitor circuit of claim 6 is configured to operate in a first phase and a second phase, wherein in the first phase:
the first switch, the third switch and the fourth switch are closed and the second switch is opened;
the first sampling circuit generates the first sampled input signal in response to the input signal;
the amplifier generates the first output signal in response to the first sampled input signal;
the PMOS transistor and the NMOS transistor both operate in a cut-off region; and
the first output signal is sampled on the first capacitor and the second capacitor.

8. The switched capacitor circuit of claim 7, wherein in the second phase:
the second switch is closed and the first switch, the third switch and the fourth switch are opened;
the load capacitor receives current from the first voltage source through the PMOS transistor if the first output signal is below the first threshold; and
the load capacitor sinks current to the second voltage source through the NMOS transistor if the first output signal is above the second threshold.

9. The switched capacitor circuit of claim 8, wherein in the second phase when the first output signal is below the first threshold:
a voltage at each of the gate terminal of the PMOS transistor and the NMOS transistor is pulled below a first predefined value;
the NMOS transistor operates in the cut-off region; and
the PMOS transistor operates in one of a linear region and a saturation region.

10. The switched capacitor circuit of claim 8, wherein in the second phase when the first output signal is above the second threshold:
a voltage at each of the gate terminal of the PMOS transistor and the NMOS transistor is pulled above a second predefined value;
the PMOS transistor operates in the cut-off region; and
the NMOS transistor operates in one of a linear region and a saturation region.

11. A method comprising:
generating a first output signal by an amplifier in response to a first sampled input signal;
generating an output signal by a second sampling circuit in response to the first output signal;
providing current to the second sampling circuit by a first current boost circuit when the first output signal is below a first threshold, the first current boost circuit includes a PMOS transistor and a first capacitor coupled to the PMOS transistor; and receiving current from the second sampling circuit in a second current boost circuit when the first output signal is above a second threshold, the second current boost circuit includes an NMOS transistor and a second capacitor coupled to the NMOS transistor, and the second threshold is greater than the first threshold, and a drain terminal of both the PMOS transistor and the NMOS transistor is coupled to the amplifier.

12. The method of claim 11 further comprising generating the first sampled input signal by a first sampling circuit in response to an input signal.

13. The method of claim 12, wherein generating the first sampled input signal further comprises:

closing a first switch; and sampling the input signal on a second capacitor.

14. The method of claim 11, wherein the second sampling circuit includes a load capacitor.

15. The method of claim 14 further comprising:

sampling the first output signal generated by the amplifier on the first capacitor and the second capacitor; and operating the PMOS transistor and the NMOS transistor in a cut-off region.

16. The method of claim 14, wherein when the load capacitor is coupled to the amplifier:

providing current to the load capacitor through the PMOS transistor when the first output signal is below the first threshold; and sinking current from the load capacitor through the NMOS transistor when the first output signal is above the second threshold.

17. The method of claim 14, wherein when the first output signal is below the first threshold:

pulling a voltage at each of a gate terminal of the PMOS transistor and the NMOS transistor below a first predefined value;

operating the NMOS transistor in a cut-off region; and operating the PMOS transistor in one of a linear region and a saturation region.

18. The method of claim 17, wherein when the first output signal is above the second threshold:

pulling the voltage at each of the gate terminal of the PMOS transistor and the NMOS transistor above a second predefined value;

operating the PMOS transistor in the cut-off region; and operating the NMOS transistor in one of a linear region and a saturation region.

19. A computing device comprising:

a processing unit;

a memory module coupled to the processing unit; and a transceiver coupled to the processing unit and the memory module, the transceiver having a switched capacitor circuit, the switched capacitor circuit comprising:

an amplifier configured to generate a first output signal in response to a first sampled input signal;

a second sampling circuit coupled to the amplifier and configured to generate an output signal in response to the first output signal;

a first current boost circuit coupled to the amplifier and the second sampling circuit and configured to provide current to the second sampling circuit when the first output signal is below a first threshold; and a second current boost circuit coupled to the amplifier and the second sampling circuit and configured to receive current from the second sampling circuit when the first output signal is above a second threshold.

20. The switched capacitor circuit of claim 10, wherein the PMOS transistor and the NMOS transistor both configured to operate in the cut-off region responsive to the first output signal between the first threshold and the second threshold.

21. The method of claim 17 further comprising operating the PMOS transistor and the NMOS transistor in the cut-off region when the first output signal is between the first threshold and the second threshold.

* * * * *